United States Patent

Bollman

(10) Patent No.: US 7,782,593 B2
(45) Date of Patent: Aug. 24, 2010

(54) MOBILE ELECTROSTATIC CARRIER WAFER WITH ELECTRICALLY ISOLATED CHARGE STORAGE

(75) Inventor: Dieter Bollman, Munich (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 456 days.

(21) Appl. No.: 11/940,544

(22) Filed: Nov. 15, 2007

(65) Prior Publication Data

US 2008/0123241 A1    May 29, 2008

(30) Foreign Application Priority Data

Nov. 24, 2006    (DE) .................... 10 2006 055 618

(51) Int. Cl.
*H01L 21/683* (2006.01)

(52) U.S. Cl. ....................................... 361/234
(58) Field of Classification Search ................. 361/234
See application file for complete search history.

(56) References Cited

U.S. PATENT DOCUMENTS

| | | | |
|---|---|---|---|
| 5,684,669 A | | 11/1997 | Collins et al. |
| 5,691,876 A | * | 11/1997 | Chen et al. .................. 361/234 |
| 5,745,331 A | * | 4/1998 | Shamouilian et al. ....... 361/234 |
| 6,529,362 B2 | * | 3/2003 | Herchen ..................... 361/234 |
| 6,909,294 B2 | * | 6/2005 | Palm et al. .................. 324/719 |
| 7,027,283 B2 | | 4/2006 | Landesberger et al. |
| 7,667,945 B2 | * | 2/2010 | Wieland et al. ............. 361/234 |

FOREIGN PATENT DOCUMENTS

| | | |
|---|---|---|
| DE | 102 32 914 A1 | 2/2004 |
| DE | 102 38 601 A1 | 3/2004 |
| DE | 103 39 997 A1 | 3/2005 |
| DE | 10 2005 008 336 A1 | 8/2006 |
| WO | 02/11184 A1 | 2/2002 |

* cited by examiner

*Primary Examiner*—Jared J Fureman
*Assistant Examiner*—Ann T Hoang
(74) *Attorney, Agent, or Firm*—Barnes & Thornburg LLP

(57) ABSTRACT

A carrier wafer includes a flat substrate with a top side and a bottom side. A first layer sequence, at least on the top side of the substrate, is arranged with area parallel to the substrate. The first layer sequence has an isolating layer. A flat, conductive electrode is arranged on the first layer sequence with area parallel to the substrate. Everywhere that it is not in contact with the first layer sequence, the electrode is surrounded by a second layer sequence having a layer made of an isolating material. In a region, which forms a tunnel window and on which the electrode is arranged, the first layer sequence is thinner than on the rest of its area. An electrical voltage can be applied to the substrate in such a way that the electrical field lines caused by the applied voltage pass through the tunnel window. The electrode can be charged, by means of a potential difference between the electrode and the substrate caused by the applied voltage, in that electrons tunnel through the tunnel window.

39 Claims, 3 Drawing Sheets

MOBILE ELECTROSTATIC CARRIER WAFER WITH ELECTRICALLY ISOLATED CHARGE STORAGE

Figure 1:
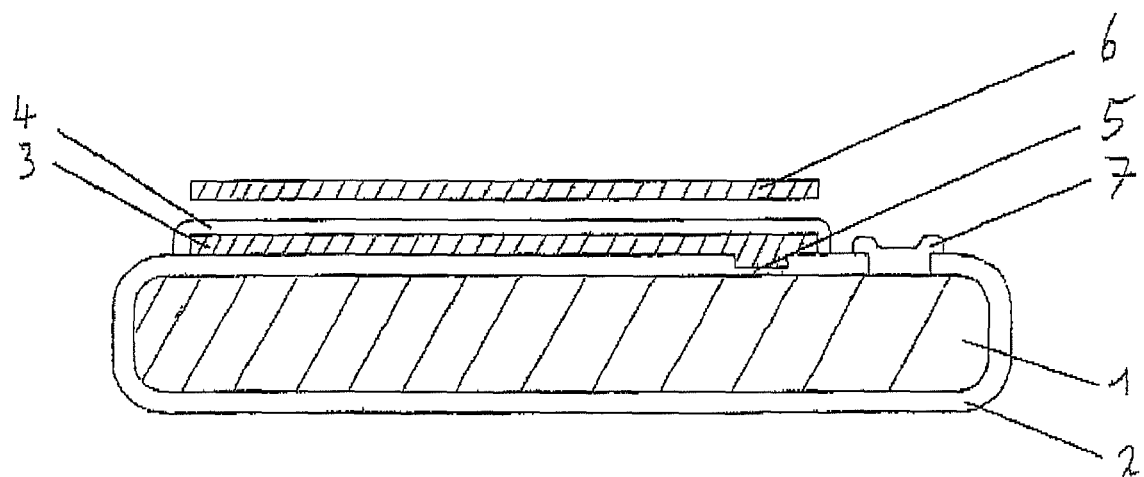

The invention relates to a carrier wafer for thin and ultra-thin semiconductor components that holds the elements to be carried by means of electrostatic attraction. In that regard, the carrier wafer exhibits a completely isolated electrode, which can be electrostatically charged in that electrons tunnel into the electrode when a voltage is applied.

In the last several years, thin semiconductor components have found widespread proliferation in the world of microelectronics. A known example of this is integrated circuits for chip cards, where today, the thickness of the silicon components is about 150 μm. Thinner and thinner wafers are used in order to save material, including in the production of solar cells. In addition, power semiconductors with chip thicknesses of approximately 100 μm represent an important market segment. Electronic components made from organic semiconductors on thin plastic films are being produced in polymer electronics as well, e.g., organic LEDs.

Growing out of this is the need for developing handling techniques that allow the handling and processing of thinner and thinner semiconductor components.

Monocrystalline silicon is a brittle material that breaks easily as the result of small mechanical stresses. At present, this risk of the wafer breaking represents the greatest technical problem in the production and processing of ultra-thin semiconductors. Moreover, ultra-thin wafers lose their usual stability, and even bend several millimeters under their own weight and inertia. This means that normal handlers which take the wafers from a tray and send it to various processing stations can no longer be used. The sharp-edged borders of the thinly ground wafers also lead to problems during transport. The frequent readjustment of the handlers to the specific deformation of the wafers at a given thickness and layer composition is uneconomical and prone to errors.

The handling of thin wafers or chips by adhering them to a carrier plate is known. The essential step in this regard is the support of the thin working wafer by a carrier wafer of normal thickness. The connecting of the two wafers takes place in that regard by means of wax, a thermoplastic adhesive or a double-sided adhesive film that can be removed due to the effect of temperature or by means of irradiation with UV light. This film is used successfully for many processing devices, such as grinders, spin etchers or measuring instruments. However, when the processing temperature gets higher than about 150° C. in plasma systems, in furnaces or in the deposition of layers, the film can be destroyed and lose its adhesive function. Because every adhesive is sensitive to certain chemicals, adhesion of this type cannot be used in baths containing solvents, acids, etc. After the processing and removal of the working wafer has been completed, adhesive layer residues are sometimes observed on the surface of the working wafer, which leads to objectionable contamination of the systems.

In patent applications DE 102 38 601 and DE 102 32 914.1, a perforated carrier wafer is described that works with an adhesive that is initially liquid. Following processing, the working wafer is removed by means of a solvent that presses through the pores of the carrier wafer. The previously mentioned problems of limited temperature tolerance, limited resistance to chemicals and possible contamination occur here as well.

The principle of the electrostatic chuck has long been known in plasma systems: After the wafer that is to be processed has been placed on the electrostatic chuck, the desired chamber pressure is set in the reactor's vacuum chamber once the gas flow has been regulated. Then, with the aid of what is usually a high-frequency alternating voltage field, the plasma is ignited and the relevant etching or deposition step is initiated. At the same time, by means of an internal high-voltage supply an direct current is applied between the anode of the reactor and the backside of the electrostatic chuck. The resulting electrical field between the backside of the wafer and the insulation layer of the chuck holds the wafer securely and allows, among other things, a cooling of the wafer on its backside by flowing small amounts of He gas against it. The insulation layer of an electrostatic chuck is usually made of temperature-resistant plastics or ceramic materials. Cooling channels on the top side of the chuck provide suitable heat dissipation on the backside of the wafer in order to keep the wafer temperature as constant as possible and to dissipate the quantities of heat introduced by the plasmas.

By doing this, a thin wafer can be held and processed just as easily as a normal thick wafer. However, the previously mentioned electrostatic chuck is a fixed component of the system. The wafer has to be removed and transported by a handler both before and after the processing. However, that is no longer possible due to the previously described problems of the ultra-thin wafers elastic deflection and risk of breaking.

In WO 02/11184, a mobile holder which fastens a wafer to a base element by means of electrostatic force is described. Here, a functional layer maintains an electrostatically active state even without an external voltage supply. However, described here are two electrodes on the same side of the holder which are contacted from the front side in the region of the flat. This corresponds to the bipolar principle.

Also part of the state of the art is DE 10 2005 008 336 A1. Described here is a carrier wafer which is made from the same material as the working wafer and which matches the working wafer in terms of its diameter and coefficient of thermal expansion, and which is produced with a thickness such that the sum of the thicknesses of the carrier wafer and the thin working wafer lies within the thickness tolerance for wafers of this diameter. This application involves a unipolar carrier wafer having an electrode made of a uniform material without lateral structuring. Here, the carrier wafer forms one electrode and the working wafer forms the second electrode of a capacitor.

In all of the electrostatic carrier wafers mentioned above, electrical contacts are always present which, upon contact with a conductive medium such as, for example, liquid (e.g., electrolyte or etching solution) or gas (e.g., plasma) lead to a discharging of the electrodes and thus to a weakening of the forces that hold the thin wafer on the carrier. Over a longer period of time and at a higher temperature, a discharge even takes place via the ambient air.

The problem thus arises of suggesting an electrostatic carrier wafer in which the electrical charge can be stored reliably over a long period of time. The charge storage should also be largely independent of the external conditions, and remain retained even if the external connections are short-circuited by contact with metal conductors or upon immersion in an electrolyte or in a plasma. Despite that, after the processing it should be possible to detach the held discoid component from the carrier wafer in as convenient and trouble-free manner as possible. In addition, the carrier wafer should be reusable and inexpensive to produce.

It is also the problem of the present invention to suggest a method for holding and detaching a discoid component with a carrier wafer.

The carrier wafer according to the invention exhibits a flat substrate on which a flat electrode made of a conductive material is arranged with parallel area. The conductive electrode is completely surrounded by isolating material. In this regard, the isolating material can be applied in the form of one or more dielectric layers. In particular, the electrode is isolated from the substrate by means of a first layer sequence with at least one isolating layer. This first layer sequence, also called a layer system, exhibits a tunnel window, in which region the first layer sequence that isolates the electrode and the substrate from each other is thinner than in the rest of its area. If an electrical field is now applied in such a way that the field lines pass through the tunnel window, the electrode can be charged in that electrons tunnel through the tunnel window into the electrode. The electrical field is produced by applying a voltage to the substrate.

As has been described, the electrically rechargeable electrode is surrounded on all sides by isolating material. It is not conductively connected with any other conductor. The charge state of this electrode, i.e., its potential, is thus undefined (floating) initially.

The all-around isolation ensures that the charge state of the electrode is retained for long periods of time. With suitable production of the isolation, the leakage current through the isolation can be very low.

At the tunnel window, however, the isolating material is configured so thin that electrons can tunnel through if there is sufficient potential difference between electrode and substrate. The tunnel current $I_{FN}$, which is determined by the oxide thickness d, the tunnel window area F, two material constants $const_1$ and $const_2$, which are dependent on the barrier height of the layer to be tunneled through and the effective electron mass in the material to be tunneled through, is described in accordance with quantum mechanics by "Fowler-Nordheim tunneling":

$$I_{FN} = const_1 * F * (U/d)^2 * \exp(-const_2/(U/d)).$$

The typical oxide thickness in the tunnel window is preferably between 10 and 100 nm for the typical potential differences of 100 to 1000 V. The area of the tunnel window, at a few µm square, is very small relative to the area of the electrode, which is around $(100\ mm)^2$. Because the dielectric is preferably significantly thicker at 1000 nm (=1 µm), almost no tunnel current normally flows here.

The potential difference that is needed for the tunneling procedure (typically with electrical fields of 6 MV/cm) can be adjusted by means of capacitive coupling. The wafer to be held, the upper dielectric, the floating electrode, the lower dielectric, and the substrate form a series connection of two capacitors with capacitances $C_1$ and $C_2$.

The capacitances $C_1$ and $C_2$ can be adjusted by means of a suitable combination of the areas of the tunnel window and the electrode and the thickness of the isolations in the tunnel window and between the electrode and the wafer to be held. A combination of capacitances approximately equal in size $C_1 = C_2$ is beneficial. Then, when a voltage is applied between the substrate and the wafer to be held, half the potential will arise at the floating electrode.

The tunnel window is conductive as long as the potential difference is large enough for a tunnel current, and isolating as long as the potential difference is small. The exp function in the formula provides for very large differences between the two states "conductive" and "isolating". Roughly speaking, the tunnel current flows until the potential has been reached.

According to the theory, the tunnel effect is not dependent on temperature. Thus, in practice an unwanted discharge of the electrode cannot occur other than through the conventional thermally activated leakage current paths (trapped charge, air, high-temperature conductor), even at a higher temperature.

With the carrier wafer according to the invention, the handling of a discoid component to be held, e.g., a film, of a working wafer to be processed, of one or more semiconductor components, of one or more chips or one or more components, can now take place in the following way. In that regard, a wafer is considered as an example of a discoid component in the following.

A wafer to be held is placed onto the uncharged electrostatic carrier wafer. By means of a charging device, a high voltage (HV) is applied between the substrate contact and the wafer to be held. A tunnel current thus flows from the substrate into the floating electrode. The charging device is removed after the charging operation.

In order to be able to hold the thin wafer securely on the carrier wafer, the electrode must be at a potential of 100 V to 1000 V relative to the surroundings. A voltage that is about twice that high should be applied in order to activate the tunnel current to charge the electrode.

Following this charging operation, the electrical charges are permanently stored in the electrode by means of a temporarily applied voltage. The wafer is now held securely by electrostatic forces, and can be processed, transported and stored. An unwanted discharge is precluded as long as the electrical fields during the processing or possibly in a plasma are smaller than the threshold for the tunnel effect.

Following processing, the wafer is again detached from the carrier wafer in that a reverse polarity high voltage is applied between the substrate contact and the wafer to be held. This voltage is suitably selected in order to achieve only a discharge of the floating electrode, and not, for example, an opposite charge.

The wafer to be held can now be taken from the carrier wafer with almost no force being exerted.

The current flowing through the tunnel window can be increased by irradiating ultraviolet light. This effect can be used in a supporting fashion in order to speed up the charging or discharging of the electrode. The detaching of the wafer from the carrier wafer can take place exclusively through irradiation with ultraviolet light, or through application of a voltage with simultaneous ultraviolet illumination. As a result of the excitation with high-energy light, the electrodes are then discharged through the isolator.

The effect can be used during charging in that a voltage is applied and the tunnel window is irradiated with UV light at the same time.

During the period of time when a component is being held, however, UV light must be prevented from striking the tunnel window in order to prevent an unwanted discharge. This can be done by making the electrode or the coating thick enough to shade it from unwanted ultraviolet light falling on it, e.g., from the sun or a fluorescent lamp.

An electrical contact that is used for applying the voltage is advantageously mounted on the substrate. The contact can pass through an isolation layer which may be present and which can surround the substrate completely or partially, or it can be placed in a region of the substrate in which no isolation layer is arranged.

The contact can be arranged at the side, i.e., between the top side and bottom side of the substrate, or on the backside (bottom side) of the substrate.

In an advantageous development of the carrier wafer according to the invention, the area of the electrode can be smaller than the area of the substrate. In this case, it is possible to place the electrical contact to the substrate on the top side of the substrate facing the electrode. In the case of a 6-inch wafer, the circle segment not covered by the flat is available as a location for the contact.

The substrate advantageously consists of a semiconductor such as silicon and is doped in a region that borders both the tunnel window and the electrical contact. The conductivity between the contact and the tunnel window is increased in this way.

The substrate can also consist of an isolating material such as glass, quartz, ceramic or plastic. It is then necessary to create under the floating electrode a conductive region that connects at least the electrical contact and the tunnel window in electrically conductive fashion. Metal layers or ITO (indium-tin oxide), for example, can be used for this purpose.

The following will now describe how the carrier wafer according to the invention can be produced by means of a production method according to the invention. To begin with, in a first step the substrate is surrounded by a dielectric for electrical isolation, forming a first isolation layer. The substrate is preferably made of silicon in order to be compatible with conventional processing equipment used in the semiconductor industry. However, glass, quartz or ceramic can also be used as the substrate material. Moreover, other semiconductor materials can also be used, such as germanium or gallium arsenide or other III/V semiconductors. In the event that silicon is used for the substrate, the dielectric is preferably silicon dioxide, best of all in the form of thermal oxide that is created by means of thermal oxidation of the substrate surface. However, a deposited CVD oxide or silicon nitride can also be used.

In a second step, at a certain location on the top side of the dielectric-surrounded substrate, the first isolation layer sequence is made thin, i.e., a tunnel window is opened in the dielectric, preferably by means of photolithography and etching. By means of another, shorter thermal oxidation of the silicon wafer, i.e., the substrate, a thin tunnel oxide is grown which then forms the tunnel window. Silicon dioxide is also especially well-suited for this thin tunnel oxide. In the event that the substrate is produced from a different material, the tunnel window must be isolated again by means of deposition. The tunnel window is configured thin enough that electrons tunnel through the first isolation layer sequence at this tunnel window when a voltage is applied that causes an electrical field that passes through the tunnel window.

In this third step, the floating electrode arranged on the substrate and the tunnel window is created by means of the deposition of polysilicon or amorphous silicon and subsequent photolithography and etching. However, thin metal layers, e.g., tungsten, titanium, titanium nitride (TiN) or similar layers that are electrically conductive, can be applied as well.

Following the deposition over the full area, the shape of the electrode is structured by means of photolithography and subsequent etching.

In a fourth step, the substrate with the electrode arranged on it is then surrounded with a dielectric in such a way that the electrode is completely covered and the substrate is completely or partially covered. The electrode is then completely isolated. The dielectric will preferably be a CVD oxide. However, another oxide or another isolator can also be used, or a layer sequence comprised of oxide/nitride/oxide (ONO).

Now, an externally accessible contact to the substrate is produced as well. This contact can be arranged on the side of the substrate facing the electrode (i.e., on the top side) in a region that is not covered by the electrode. Alternatively, however, the contact can also be arranged on the side of the substrate between the top side and its bottom side facing away from the electrode, or else on the bottom side (backside) of the substrate. To produce the contact, if the contact is being arranged in a region exhibiting an isolation layer, an opening is first made in the isolation layer sequence surrounding the substrate. This can take place by means of photolithography and etching, for example. An externally accessible contact to the substrate is then produced by means of the deposition of a metal, e.g., aluminum, in the opening or at the location provided for the contact. If the contact is accommodated on the backside of the substrate, then preferably the entire backside is freed of oxide and is metallized.

In the substrate region that borders the tunnel window and the contact and before it is surrounded with a dielectric in the first step, doping can preferably be introduced by means of implantation or the diffusion of suitable doping agents in order to improve the electrical conductivity of the substrate between the contact and the tunnel window.

Figure 2:
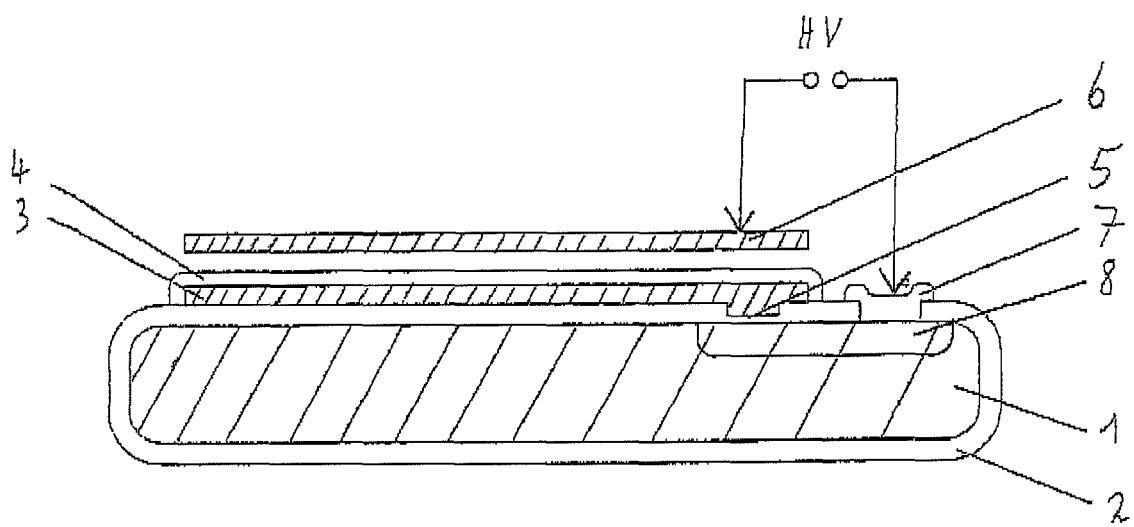
Figure 3:
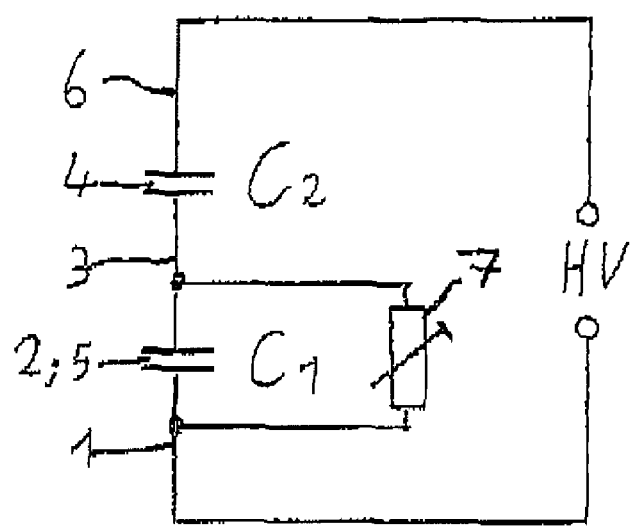

In the following, the carrier wafer according to the invention will be explained with the aid of several examples. The following are shown:

FIG. 1 An arrangement according to the invention, with a carrier wafer and a wafer to be held, FIG. 2 An arrangement according to the invention, having a carrier wafer that is doped in the region between the contact and the tunnel window, and FIG. 3 An equivalent circuit diagram for the arrangement according to the invention.

FIG. 1 shows an arrangement according to the invention, consisting of a carrier wafer and a component 6 to be held. A substrate 1 is surrounded by a first isolation layer sequence 2. At a location on the top side of the substrate 1, the isolation layer 2 is configured thinner so that it forms a tunnel window 5. Arranged on the top side of the isolation layer sequence 2 on the tunnel window 5 is a floating electrode 3, which is surrounded by a second isolation layer sequence 4, at least everywhere that it is not in contact with the isolation layer 2. Arranged on the side of the electrode 3 facing away from the substrate 1 on the second layer sequence 4 is a semiconductor element 6 to be held, with area parallel to the electrode 3 and the substrate 1.

The wafer 6 to be held lies against the second layer sequence 4, whereby the second layer sequence 4 isolates the floating electrode 3 from the component 6 to be held. Arranged in a region of the top side of the substrate 1 that is not covered by the electrode 3 and the layer sequence 4 is an electrical contact 7 that produces a contact to the substrate 1 through the first isolation layer sequence 2.

The substrate 1 can, for example, be made of silicon, germanium, gallium arsenide, other III/V semiconductors, as well as glass, quartz, ceramic, plastic or metal. In the event that the substrate 1 is produced from silicon, the dielectric 2 is preferably silicon dioxide, e.g., in the form of a thermal oxide. The floating electrode 3 can, for example, be made by means of the deposition of polysilicon or amorphous silicon. However, other thin metal layers can also be used, e.g., tungsten, aluminum, titanium, titanium nitride (TiN) or similar layers that are electrically conductive. The second isolation layer sequence 4 can, for example, be a CVD oxide. However, other oxides can be used as well.

FIG. 2 shows a carrier wafer according to the invention to which a voltage HV can be applied. The same reference symbols correspond to the same components as in FIG. 1. The high voltage HV is applied between the contact 7 and the semiconductor component 6 to be held. In order to improve the electrical conductivity of the substrate 1 between the contact 7 and the tunnel window 5, the substrate is doped in a region 8 that borders the contacting 7 and the thin location 5 (tunnel window).

If the substrate 1 is produced from an electrically isolating material, then the electrical connection between the contact 7 and the tunnel window 5 is produced by means of a conductive region 8.

FIG. 3 shows an equivalent circuit diagram for the carrier wafer according to the invention. Here again, the same reference symbols correspond to the same components as in the other Figures. Section 6 of the circuit diagram corresponds to the wafer to be held. The upper dielectric 4 isolates the floating electrode 3 from the wafer 6 to be held, and thus represents a capacitance $C_2$. The first isolation layer sequence 2 with the tunnel window 5 isolates the electrode 3 from the substrate 1 and thus represents a capacitance $C_1$. If the voltage applied between the substrate 1 and the component 6 to be held is large enough, then, as long as the capacitances $C_2$ 4 and $C_1$ 2;5 are not charged, a high potential difference at the isolation layer 2 and the tunnel window 5 falls off. If this potential difference between the substrate 1 and the electrode 3 is now large enough, then so many electrons can tunnel through the tunnel window 5 that the electrode 3 charges. In that case, a current flows through the tunnel window 5, so the electrode 3 and the substrate 1 are no longer completely isolated form each other. This is illustrated in the equivalent circuit diagram by means of variable resistance 7 connected in parallel with the capacitance $C_1$. This resistance 7 thus represents a temporary conductive connection between the substrate 1 and the electrode 3. Its value depends on the applied voltage.

The capacitances $C_1$ and $C_2$ are connected in series, thus $1/C=1/C_1+1/C_2$ applies for the total capacitance C in the illustrated circuit diagram.

The capacitance of the capacitor $C_1$ 2;5 formed by the substrate 1 and the electrode 3 that are isolated from each other by the isolation layer 2 and the tunnel window 5 is calculated from the proportions of the area of the substrate under the electrode $A_E$ and in the tunnel window $A_T$ and the thicknesses of the oxides under the electrode $d_E$ and in the tunnel window $d_T$ as $$C_1 = \varepsilon * A_E/d_E + \varepsilon * A_T/d_T$$

The capacitance of the upper capacitor $C_2$ 4 is calculated from the area $A_W$ of the wafer to be held and the thickness $d_W$ of the dielectric 4 to be $$C_2 = \varepsilon * A_W/d_W.$$

It is beneficial if the two capacitances $C_1$ and $C_2$ are approximately equal in size. Then, with a voltage applied between the substrate 1 and the wafer 6 to be held, half the potential arises at the floating electrode 3.

The carrier wafer according to the invention has the following advantages relative to the state of the art. The charge of the floating electrode can be reliably stored over a long period of time. The storage is not dependent on external conditions, and remains retained even if the external connections are short-circuited by contact with metal conductors or upon immersion in an electrolyte or in a plasma. The stored charge also remains retained at high temperatures. Despite that, the component to be held can be conveniently and easily detached from the carrier wafer following processing. The carrier wafer is reusable and inexpensive to produce.

The invention claimed is:

1. A carrier wafer, with
  a flat substrate with a top side and a bottom side,
  a first layer sequence, at least on the top side of the substrate, arranged with area parallel to the substrate and with at least one isolating layer,
  and at least one flat, conductive electrode arranged on the first layer sequence with area parallel to the substrate,
  whereby, everywhere that it is not in contact with the first layer sequence, the at least one electrode is surrounded by a second layer sequence having at least one layer made of an isolating material,
  wherein
  in at least one region, which forms at least one tunnel window and on which the at least one electrode is arranged, the first layer sequence is thinner than on the rest of its area,
  and wherein an electrical voltage can be applied to the substrate in such a way that the electrical field lines caused by the applied voltage pass through the at least one tunnel window,
  and wherein the electrode can be charged, by means of a potential difference between the electrode and the substrate caused by the applied voltage, in that electrons tunnel through the at least one tunnel window.

2. A carrier wafer according to claim 1 wherein the first layer sequence extends at least partially over the side of the substrate between the top side and bottom side and/or the bottom side of the substrate.

3. A carrier wafer according to claim 1 wherein the second layer sequence extends completely or partially over the substrate and/or the first layer sequence arranged on the substrate.

4. A carrier wafer according to claim 1 wherein the area of the at least one electrode is smaller than the area of the substrate.

5. A carrier wafer according to claim 1 wherein an electrical contact that is in contact with the substrate passes through at least one layer sequence that is arranged on the substrate or is arranged in a region of the substrate surface that is not coated by the first or second layer sequence.

6. A carrier wafer according to claim 5 wherein the electrical contact on that side of the substrate which faces that at least one electrode is arranged in a region of the substrate that is not covered by the at least one electrode.

7. A carrier wafer according to claim 5 wherein the electrical contact on the substrate is arranged between the top side and bottom side of the substrate or on the bottom side of the substrate.

8. A carrier wafer according to claim 5 wherein the substrate is doped or conductive in a region that borders the at least one tunnel window and the electrical contact.

9. A carrier wafer according to claim 5 wherein a conductive layer and/or a layer that exhibits ITO is arranged on the substrate in a region that borders the at least one tunnel window and the electrical contact.

10. A carrier wafer according to claim 1 wherein the at least one electrode is configured permeable to ultraviolet light at least in a region over the at least one tunnel window, or is configured so thin that it is permeable to ultraviolet light.

11. A carrier wafer according to claim 1 wherein the substrate is transparent or permeable to ultraviolet light at least in the region that borders the at least one tunnel window between the top side and bottom side.

12. A carrier wafer according to claim 1 wherein the substrate exhibits quartz and/or ITO and/or exhibits ITO in the conductive region.

13. A carrier wafer according to claim 1 wherein the at least one electrode and/or the first layer sequence and/or the second layer sequence and/or the substrate is impermeable to ultraviolet light.

14. A carrier wafer according to claim 1 wherein the substrate exhibits or is made of silicon, glass, quartz, germanium, gallium arsenide, ceramic, plastic and/or a III/V semiconductor.

15. A carrier wafer according to claim 1 wherein the at least one electrode exhibits or is made of a metal, e.g. aluminum, tungsten, titanium, titanium nitride (TiN).

16. A carrier wafer according to claim 1 wherein the at least one electrode exhibits or is made of polysilicon and/or amorphous silicon and/or ITO.

17. A carrier wafer according to claim 1 wherein the first layer sequence exhibits or is made of a thermal oxide, CVD oxide and/or another oxide.

18. A carrier wafer according to claim 1 wherein the second layer sequence exhibits or is made of CVD oxide, silicon oxide, silicon nitride and/or another oxide.

19. A carrier wafer according to claim 1 wherein the thickness of the first layer sequence in the region of the at least one tunnel window lies above 10 nm and/or below 100 nm.

20. A carrier wafer according to claim 1 wherein the area of the at least one tunnel window is more than 1 $\mu m^2$ and/or less than 100 $\mu m^2$.

21. A carrier wafer according to claim 1 wherein the thickness of the first layers sequence in the region outside of the one tunnel window is more than 500 nm and/or less than 5000 nm, preferably 1000 nm.

22. A carrier wafer according to claim 1 wherein, if a voltage is applied which is one of more than 100 volts and less than 2000 volts, electrons tunnel through the tunnel window.

23. A carrier wafer according to claim 1 wherein two flat electrodes with areas parallel to the substrate are arranged on the first layer sequence, and wherein the first layer sequence exhibits at least two tunnel windows, whereby each electrode is arranged on at least one of the at least two tunnel windows.

24. An arrangement for retaining a discoid component with a carrier wafer according to claim 1, and the discoid component.

25. An arrangement according to claim 24 wherein the discoid component is a film, a working wafer to be processed, at least one semiconductor component or at least one chip.

26. An arrangement according to claim 24 wherein the potential difference is generated by applying a voltage between the substrate and the discoid component.

27. An arrangement according to claim 26 wherein the discoid component is contacted by needles.

28. An arrangement according to claim 24 wherein the capacitance of the substrate and the electrode is equal to the capacitance of the electrode and the discoid component, or differs by less than the factor 10.

29. An arrangement according to claim 24 wherein the material of the discoid component contains or is made of Si, a III-V semiconductor, AlGaAsP, Ge, GaAs, InP and/or InGaAs or film, e.g., plastic film.

30. An arrangement according to claim 24 wherein the sum of the thickness of the carrier wafer and the thickness of the discoid component is within the thickness tolerance range prescribed for wafers with a diameter corresponding to that of the carrier wafer.

31. An arrangement according to claim 24 forming a level, flat disk, the diameter of which is substantially greater in the plane of the first surface than its thickness.

32. An arrangement according to claim 24 wherein the discoid component is fixed on the carrier wafer electrostatically.

33. A method for the electrostatic holding of a discoid component on a carrier wafer according to claim 1 wherein the discoid component is deposited on the carrier wafer and an electric voltage is applied in such a way that electrons tunnel through the at least one tunnel window.

34. A method according to claim 33 wherein the voltage is applied between the discoid component and the substrate.

35. A method according to claim 33 wherein the discoid component is held, even without an applied voltage, for the duration of a processing of the component.

36. A method for detaching a discoid component from an arrangement according to claim 24 wherein a voltage for discharging the at least one electrode is applied via the at least one tunnel window.

37. A method according to claim 36 wherein the voltage is applied between the discoid component and the substrate.

38. A method according to claim 33 wherein the current flowing through the at least one tunnel window is increased in that the tunnel window is irradiated with ultraviolet light.

39. A method according to claim 33 wherein a voltage of more than 100 volts and/or less than 2000 volts is applied.

* * * * *